United States Patent [19]

Deppe et al.

[11] Patent Number: 4,769,108

[45] Date of Patent: Sep. 6, 1988

[54] SYSTEM FOR THE PRODUCTION OF SEMICONDUCTOR COMPONENT ELEMENTS

[75] Inventors: Johannes Deppe, Erlangen; Dieter Löwer, Schwabach, both of Fed. Rep. of Germany

[73] Assignee: Semikron Gesellschaft Für Gleichrichterbau, Nuremberg, Fed. Rep. of Germany

[21] Appl. No.: 881,083

[22] Filed: Jul. 2, 1986

[30] Foreign Application Priority Data

Jul. 6, 1985 [DE] Fed. Rep. of Germany ....... 3524301

[51] Int. Cl.[4] ...................... B44C 1/22; H01L 21/306; B32B 31/00
[52] U.S. Cl. ................................... 156/631; 156/645; 156/659.1; 156/662; 156/230; 156/247; 156/264; 156/265
[58] Field of Search ............... 156/626, 630, 631, 633, 156/634, 645, 655, 656, 657, 659.1, 662, 264, 265, 247, 230; 29/580, 583, 412–415; 51/281 R, 310; 428/446

[56] References Cited

U.S. PATENT DOCUMENTS

| | | | |
|---|---|---|---|
| 3,706,129 | 12/1972 | McCann | 29/583 |
| 3,762,973 | 10/1973 | Gabrail | 156/645 X |
| 3,947,952 | 4/1976 | Miller et al. | 29/578 |
| 4,023,997 | 5/1977 | Wanesky | 156/631 |

FOREIGN PATENT DOCUMENTS 2340142 3/1974 Fed. Rep. of Germany.
2418813 11/1974 Fed. Rep. of Germany.

Primary Examiner—William A. Powell
Attorney, Agent, or Firm—Horst M. Kasper

[57] ABSTRACT

A system is disclosed for the production of a number of disk-shaped semiconductor bodies from a large face contacted semiconductor starting chip, which is attached to a carrier plate, where in several steps simultaneous treatment of all semiconductor bodies in the set is obtained and where in further steps an individual treatment occurs. This method is improved by connecting the semiconductor component bodies generated by dicing of the starting chip to a foil-like structure with the aid of a silicone rubber with particular properties. A device for supporting the structure and for further treatment of the therein mechanically stable supported semiconductor device element is attached with silicon rubber to the structure before detaching of the starting disk. This support means is detached jointly with the structure from the carrier plate. The structure of semiconductor component elements and silicone rubber attached to the support means is subjected to further processing steps including at least some measurements, and thereupon the semiconductor components elements are separated. A defined edge profile is generated at the sections forming semiconductor component elements, for example by etching or sandblasting within the process of dicing the starting semiconductor chip.

18 Claims, 2 Drawing Sheets

---

1. ADHESIVE ATTACHMENT OF A SEMICONDUCTOR STARTING CHIP TO A CARRIER PLATE

2. PLACING OF A MASK WITH A DICING PATTERN ONTO THE FREE CHIP SURFACE

3. DICING THE STARTING CHIP INTO SEMI-CONDUCTOR COMPONENT ELEMENTS CORRESPONDING TO THE PATTERN OF THE MASK

PRODUCTION OF A DEFINED EDGE PROFILE FOR EACH SEMICONDUCTOR COMPONENT ELEMENT

4. ENTERING OF A SURFACE STABILIZING MATERIAL INTO THE INTERMEDIATE SPACES GENERATED BY DICING OF THE SEMICONDUCTOR STARTING CHIP

5. APPLICATION OF A DEVICE AT THE FOIL-SHAPED STRUCTURE OF THE SEMICONDUCTOR ELEMENTS FORMED WITH THE SURFACE STABILIZING MATERIAL

6. DETACHMENT OF THE DEVICE WITH THE STRUCTURE FROM THE CARRIER PLATE

7. SIMULTANEOUS FURTHER PROCESSING OF ALL SEMICONDUCTOR COMPONENT ELEMENTS AT LEAST UP TO MEASUREMENT AND CLASSIFICATION

8. SEPARATION OF THE SEMICONDUCTOR COMPONENT ELEMENTS

1. ADHESIVE ATTACHMENT OF A SEMICONDUCTOR STARTING CHIP TO A CARRIER PLATE

2. PLACING OF A MASK WITH A DICING PATTERN ONTO THE FREE CHIP SURFACE

3. DICING THE STARTING CHIP INTO SEMI-CONDUCTOR COMPONENT ELEMENTS CORRESPONDING TO THE PATTERN OF THE MASK

PRODUCTION OF A DEFINED EDGE PROFILE FOR EACH SEMICONDUCTOR COMPONENT ELEMENT

4. ENTERING OF A SURFACE STABILIZING MATERIAL INTO THE INTERMEDIATE SPACES GENERATED BY DICING OF THE SEMICONDUCTOR STARTING CHIP

5. APPLICATION OF A DEVICE AT THE FOIL-SHAPED STRUCTURE OF THE SEMICONDUCTOR ELEMENTS FORMED WITH THE SURFACE STABILIZING MATERIAL

6. DETACHMENT OF THE DEVICE WITH THE STRUCTURE FROM THE CARRIER PLATE

7. SIMULTANEOUS FURTHER PROCESSING OF ALL SEMICONDUCTOR COMPONENT ELEMENTS AT LEAST UP TO MEASUREMENT AND CLASSIFICATION

8. SEPARATION OF THE SEMICONDUCTOR COMPONENT ELEMENTS

FIG. 1

SYSTEM FOR THE PRODUCTION OF SEMICONDUCTOR COMPONENT ELEMENTS

BACKGROUND OF THE INVENTION

1. Field of the Invention

The invention relates to a system for the production of semiconductor component elements produced from a large face semiconductor starting chip that comprises a layer sequence with at least one p-n junction between two main surfaces and is provided with metallic coating at each main surface.

2. Brief Description of the Background of the Invention Including Prior Art

A method is known for the processing of semiconductor chips that includes the adhesive attachment onto a carrier plate, the attachment of a mask with a dicing pattern on the remaining free main face of the semiconductor chip, dicing of the semiconductor chip into semiconductor component elements with a smaller area extension, entering of a passivating and stabilizing substance into the intermediate spaces between the elements generated by subdividing with simultaneous covering of the semiconductor surface regions of the semiconductor component elements that became exposed during the dicing process, and followed by detachment of the element from the carrier plate. With carefully controlled processing steps, this method allows a substantially more economical production, as compared to prior methods of completely individual treatment, of a number of semiconductor bodies of smaller area extension, designated in the following as semiconductor component elements, from a large surface semiconductor disk. These semiconductor component elements are, for example, useful in the context of semiconductor circuits in power electronics.

However, this method is associated with some disadvantages. The steps following the detachment of the semiconductor face and leading to the completion of measured and classified elements are performed in individual processing requiring large time expenditures. Such steps can include a cleaning with a solvent such as, for example, trichloro-ethylene, a heating step for stabilization of the rubber, for example at 200 degrees centigrade for a time of about 16 hours. The measurement of the elements can include determination of the reverse voltage cold at ambient temperature and hot at about 150 degrees centigrade, determination of switching times in the case of fast diodes, and determination of the forward voltage drop. The element can further be classified, sorted into groups, and labelled.

It is not possible to mechanize this sequence and the performance of these further method steps in a desired way, since, in particular, these small areas semiconductor component elements cannot be transported as a bulk material, which would be the preferred transport. Such bulk material would be small part semiconductor elements, which are transported in quantities and without a particular mutual spacial arrangement. Transport as a bulk material would result in an interference with the electrical properties of the semiconductor component elements. The continually growing requirements of semiconductor application industries for more cost favorable semiconductor circuits of high quality make it imperative that the production processes for semiconductor elements become more and more economical.

The state of the art is set forth for example in U.S. Pat. No. 3,432,919, in U.S. Pat. No. 4,228,581 and in U.S. patent application Ser. No. 355,718 filed Apr. 30, 1973 by Trevail et al.

SUMMARY OF THE INVENTION

1. Purposes of the Invention

It is an object of the present invention to improve a method for the production of semiconductor component elements such that not only individual but all processing steps required for obtaining a device grade semiconductor element can be performed simultaneously and in a combined way at all elements generated from a semiconductor starting chip, that is, during their joint placement on a carrier plate.

It is another object of the present invention to allow for a substantial mechanization of the processing of the semiconductor elements, which would include measurement and classification of semiconductor component elements.

It is yet a further object of the present invention to provide a composite consisting of a semiconductor chip part substantially oriented before dicing together with a stabilizer that will maintain these elements together for further processing.

These and other objects and advantages of the present invention will become evident from the description which follows.

2. Brief Description of the Invention

The present invention provides a method for the production of semiconductor component elements in which initially a carrier plate is adhesively attached to a large face semiconductor starting chip that includes a layer sequence with at least one p-n junction between two main surfaces, each of which is provided with a metallic coating, in such a way that one main surface remains free. A mask with a dicing pattern is applied on the free main surface, the large face semiconductor starting chip is diced into semiconductor component elements of smaller area extension, and a defined edge profile is generated at each semiconductor component element. A silicone rubber is entered into the dicing generated intermediate spaces between the semiconductor component elements, simultaneously covering the semiconductor surface regions of the semiconductor component elements exposed due to the dicing. The silicone rubber has the properties of forming a solid attachment on the semiconductor material, of easily removing from the support of the starting chip, and of being suitable for use at temperatures for soft soldering operations with higher melting soft solders. A flexible structure, which is formed from the straps of silicone rubber corresponding to the dicing pattern and from the semiconductor component elements supported between these straps, is disengaged from the carrier plate, and means are applied for at least a partially mechanized further processing of the semiconductor component elements up to including measurements and classification. The semiconductor component elements are then separated along and within the rubber strips. The attachment of the carrier plate can be performed manually. Resin can be applied to a glass plate, a heating to about 100 degrees centigrade can be provided and the wafer is placed in position.

Etching, sandblasting, sawing, or ultrasonic drilling can be used to dice the large face semiconductor starting plate and to generate the desired edge profile.

The carrier plate employed can be produced from a member of the group consisting of glass, ceramics, plastic, or metal, or of a composite thereof.

The mask can be produced for example by application of photoresist. The main surface is the surface provided for a current contacting. The elements are sections of the original wafer to provide operational pellet sections. Grooves or wedges are generated by subdividing the wafer. These grooves and wedges are protectingly covered with the passivating material. Subdividing is a separation of the semiconductor material. The adhesive attachment can be produced with wax. A defined edge profile can be obtained for example by bevelling of the jacket face of each element. The defined edge profile is generated by etching entailing a material removal depending on carrier type and doping concentration.

The passivating and stabilizing substance exhibit an adhesive effect but can be removed easily from the substrate.

The temperature during soft soldering of higher melting metals can be in the range of from about 250 to 400 degrees centigrade.

By placing the passivating and stabilizing material into the grooves all elements are joined by glueing. The connections hold even in case of a removal of the pellets such that a flexible structure is present.

A support frame surrounding the semiconductor elements can be employed in the further mechanized processing of the semiconductor component elements and can be disposed on the carrier plate. The support frame can be connected with the outer semiconductor component elements with the silicone rubber after the dicing of the starting semiconductor chip and can be detached with the semiconductor component elements from the carrier plate.

Further mechanized processing can include a cyclic operation performed on the flexible structure, where treatment and transport are performed according to a preset cycle from step to step.

The support frame or support device can be, for example, a metal or insulating material plate of an appropriate thickness and provided with a relatively large hole, where the flexible structure is attached at the inner face of the plate with an adhesive.

Alternatively, a support plate comprising bore holes corresponding in their geometrical disposition to and surrounding the semiconductor component elements can be employed in the further mechanized processing of the semiconductor component elements. The support plate can be solidly attached to the semiconductor component elements after the formation of the structure on the support plate with a centered coordination of bore holes and semiconductor component elements and can be detached with the semiconductor component elements from the carrier plate.

The support plate with bore holes can be solidly attached to the semiconductor component elements with an adhesive, or it can be placed onto and connected to the semiconductor component elements before the hardening of the silicone rubber and can be connected to the semiconductor elements based on the adhesive force of the silicone rubber.

The position of the semiconductor component elements can be adjusted in a support part, which can be made of metal or plastic, where the support part holds the semiconductor component elements during further processing. The adjustment includes a position-determined and substantially unchanged mutual spacial arrangement of at least two components, which are here the structure and a device for further processing. Means for achieving the adjustment include bevelled corners of a support frame or a support plate, bore holes for placement of support frame or support plate onto a conveyor or a fixed pin support, and recesses at a respective circumference of support frame or support plate.

Another aspect of the present invention provides a flexible processing structure comprising semiconductor component elements having defined edge profiles and disposed in a plane after separation of a starting chip while still having a joint base crystal orientation in space and with silicone rubber disposed between the still oriented semiconductor component elements such that a flexible elastic sheet structure results suitable for further processing of the semiconductor component elements.

The flexible and/or foil-like processing structure can comprise a substantially smooth upper and lower surface composed of semiconductor component element surfaces and of silicone rubber surfaces wherein the semiconductor component element is a silicon chip.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention:

FIG. 1 is a schematic diagram illustrating the processing steps of the present invention.

DESCRIPTION OF INVENTION AND PREFERRED EMBODIMENTS

Figure 2:
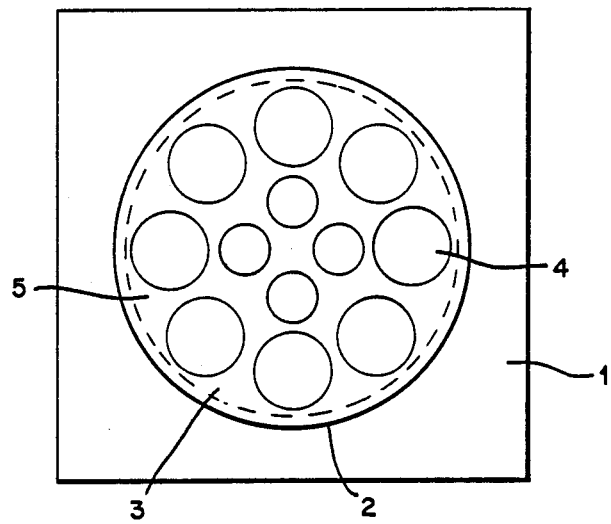
FIG. 2 is a schematic view illustrating in a top view the disposition of the semiconductor component elements.

The present invention provides a method for the production of semiconductor component elements which, as is known in the prior art, comprises adhesively attaching a carrier plate to a large face semiconductor starting chip having a layer sequence with at least one p-n junction between two main surfaces, each of which is provided with a metallic coating, in such a way that one main surface remains free, applying a mask with a dicing pattern on the free main surface, dicing the large face semiconductor starting chip into semiconductor component elements of smaller area extension, entering a passivating and stabilizing material in the dicing generated intermediate spaces between the semiconductor component elements and simultaneously covering the semiconductor surface regions of the semiconductor component elements exposed because of the dicing, and disengaging the semiconductor component elements from the carrier plate.

The improvement provided by the present invention comprises generating at each semiconductor component element 4 a defined edge profile during the dicing process and applying silicone rubber 5 as a passivating and stabilizing material, where the silicone rubber has the properties of forming a solid attachment on the semiconductor material, of easily removing from the support of the starting chip and of being suitable for operation at temperatures for soft soldering operations with higher melting soft solders. Further, a flexible structure of the semiconductor component elements and of the silicone rubber is formed where the flexible structure is composed of the straps of silicone rubber corresponding to the dicing pattern and of the semiconductor component elements supported between these straps. The flexible structure is disengaged from the carrier plate, means are applied for at least a partially mechanized further processing of the semiconductor component elements up to including measurements and classification, and the semiconductor component elements are separated along and within the rubber straps.

A support frame 1 surrounding the semiconductor elements 4 can be employed in the further mechanized processing of the semiconductor component elements. The support frame 1 can be disposed on the carrier plate and, after the dicing of the starting semiconductor chip 3, can be connected with the outer semiconductor component elements with the silicone rubber 5. The support frame can be detached with the semiconductor component elements from the carrier plate.

Alternatively, a support plate 13, with bore holes 14 corresponding in their geometrical disposition to and surrounding the semiconductor component elements, can be employed in the further mechanized processing of the semiconductor component elements 4, to which the support plate 13 can be solidly attached after the formation of the structure on the support plate 13 with a centered coordination of bore holes 14 and semiconductor component elements 4. The support plate 13 can be detached with the semiconductor component elements 4 from the carrier plate 10.

The support plate 13 can be solidly attached to the semiconductor component elements 4 with an adhesive 12.

Alternatively, the support plate 13 can be placed onto the semiconductor component elements 4 before the hardening of the silicone rubber 5 and can be connected to the semiconductor component elements 4 based on the adhesive force of the silicone rubber.

Figure 3:
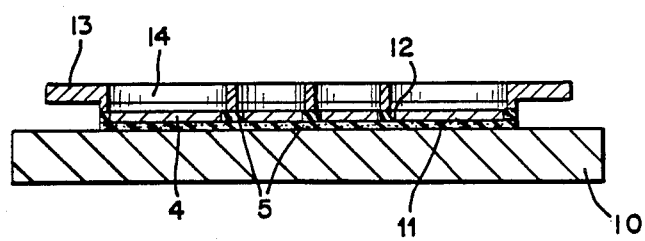
FIG. 3 is a sectional view illustrating the layout of semiconductor component elements, of carrier plate, and of support plate.

The invention method is illustrated further by way of FIGS. 1 to 3. FIG. 1 shows the course of the production of the semiconductor component elements in a schematic way. FIGS. 2 and 3 show a plan view or, respectively, a cross-sectional view with the formation and placement in each device as a means for a mechanical further treatment of the semiconductor device elements. The same parts are associated with the same numerals in the various Figs.

The starting semiconductor chip 3 (compare FIG. 2) is comprised of, for example, silicon and is employed for the production of usually tablet-shaped semiconductor component elements. The starting semiconductor chip has a layer sequence with at least one p-n junction between the two main surfaces, and it is provided at each of the main surfaces with a metallic coating as a contact electrode for the connection of current leads. For example, an n-conducting 4 inch silicon wafer, which has a doping concentration of from about $10^{13}$–$10^{14}$ atoms/cm$^3$, can be employed. The wafer can comprise the following layers: a highly resistive middle zone (starting material), a one side highly doped n-conducting layer obtained by diffusion, and a second side highly doped, p-conducting outer zone ($10^{18}$–$10^{20}$ Atoms/cm$^3$. Thus a layer sequence $n^+$-$n^-$-$p^+$ is present. Contact zones can be present on the outer zones of, for example, nickel-gold or nickel-silver, which have a respective thickness of from about 1 to 5 micrometer and 50 to 100 micrometer.

Such a semiconductor starting chip with a diameter of, for example, about 100 millimeters, is adhesively attached to a carrier plate, which can be made of glass, plastic, metal or ceramic, or of a composite of one or more such materials. For example, carrier plates of metal can be provided with a plastic coating. In order to attach the semiconductor starting chip on the carrier plate, there are advantageously employed so-called melting adhesives. The semiconductor wafer can have a thickness of from about 200 to 400 micrometers.

The melting adhesives can include coumarone-indene-resin or distillation products obtained in the processing of raw benzene (compare Römpp, Chemie-Lexikon, 4th edition, Vol. I, Column 920 or 8th edition, Vol. II, page 822). Such material exhibits adhesive properties upon heating, and a wafer can be adhesively attached by heating to about 100 degrees centigrade.

A layer for covering sections of the semiconductor starting chip is generated on the free upper main surface of the semiconductor starting disk by a masking process. The sections correspond to the later produced tablet-shaped semiconductor component elements. The intermediate zones, which are not covered, form the dicing pattern for the semiconductor starting chip.

The masking process can be performed by placing a layer of silk screen ink on the starting disk before the attachment to the substrate. The silk screen ink is fixed by the heating process associated with the adhesive attachment, that is, the silk screen ink dries to a mechanically stable layer. The masking can be performed along the teachings set forth in U.S. Pat. No. 4,228,581. The reference teaches to employ picein in the silk screen method.

Then this construction is subjected to, for example, an etching process, where the semiconductor starting disk is diced along the exposed, strip-shaped zones into the predetermined number of semiconductor component elements. The etching process can be performed with an etch mixture for example taught in German Patent Application Laid Open DE-OS No. 2,437,048. For a layer sequence as mentioned above, the edge profile would be a simple bevel of the jacket face of the elements provided and the cross-section would decrease from the $p^+$-layer to the $n^+$-layer. This edge is generated by etching of grooves in strip shaped regions of the starting wafer, which grooves are not masked or covered.

According to the invention, in the context of the dicing of the semiconductor starting disk into semiconductor component elements, there are generated defined edge profiles at the edge zones of the semiconductor component elements. The edge profiles can be generated according to the teaching of U.S. Pat. No. 4,228,581 to Chadda.

This can occur simultaneously with the dicing of the semiconductor starting chip, e.g. by an etching process, or, alternatively, in a successive etching process. In this context etch solutions can be employed that in addition simultaneously result in a final polishing effect on the exposed semiconductor surfaces.

The dicing of the starting disk and the formation of the edge profile at the semiconductor component elements can also be achieved with sandblasting, sawing, or ultrasonic drilling followed by a polishing etching of the free exposed semiconductor surfaces. The two process steps can be performed successively or, under certain circumstances, simultaneously.

For subdivision by sandblasting, one can employ the so-called inject-process. Air passing through a suitable formed tube sucks sand. The sand can be $Al_2O_3$ having a grain size of from about 40 to 70 micrometers. The pressure employed can be 2.5 bar, the nozzle diameter for the air can be 4 mm, the nozzle diameter for the sand can be 9 millimeter, and the distance from the substrate can be for example about 80 millimeters.

A diamond saw is preferably employed for subdivision by sawing, which has a programmable rotating saw blade of a thickness of about 30 microns. The subdivision can further be obtained by sawing apart with a cut thickness of about 120 micrometers followed by etching.

The thus generated intermediate spaces between each neighboring semiconductor element reach through to the carrier plate, and material is introduced into them to provide a stabilizing and passivating covering of the surface regions to be protected. The stabilizing and passivating covering protects the surface based on a chemical and/or mechanical binding of impurities and defects in the surface and maintains the properties achieved for the device element. The areas to be protected include the ditches generated at the side faces during etching, in particular where the p-n junction meets the surface. Suitable stabilizing and passivating materials include lacquers (such as silicone lacquer, CH-3 sold by Wacker Chemical Corporation, New York), glass (such as taught in U.S. Pat. No. 4,202,916 by Chadda), or silicone rubber as a polymerizable material with silicone base.

According to the present invention, a silicone rubber that shows good adhesion to the semiconductor material, can be detached easily from the support of the semiconductor starting chip, and exhibits a high temperature stability during soft soldering processes is employed for this purpose. The silicon rubber further has to hold to the support frame 1.

The second of the required properties of the silicon rubber, that is, the easy detachability from the support of the semiconductor starting disk is determined by the fact that the semiconductor component elements, in order to achieve the purposes of the invention, must be detached jointly from the adhesive employed for the attachment of the semiconductor starting disk so that the silicon rubber employed also must be detachable from the adhesive. The whole set-up is placed in a solvent such as trichloroethylene until the adhesive material has dissolved in the solvent. Thereby the structure is separated from the support frame. The detachment of the structure (elements+rubber webs) is achieved with solvents such as, for example, trichloroethylene. The solvent dissolves the adhesive disposed between rubber and substrate and thus eliminates the adhesive.

Furthermore, the third property of the silicon rubber employed is determined by a soft solder connection of the intended semiconductor component elements with current leads, where in particular lead solder with additives such as, for example, silver and tin, is employed for the production of semiconductor component elements according to the invention, which have high thermal stability and high load alternation stability. The solder for example can have a composition of 95 weight percent lead, 2.5 weight percent tin and 2.5 weight percent silver. The melting point can be in a range of from about 300 to 350 degrees centigrade and can be 325 degrees centigrade.

Cold and hot hard curing types of rubber can be employed. Such rubbers can be obtained for example from Shin-etsu Chemical Corporation, Japan.

After the hardening of the rubber, a structure is present on the carrier plate where the semiconductor component elements are supported with the aid of the intermediately disposed rubber straps.

According to the invention, this substantially flexible and/or foil-shaped structure is now connected with means for at least a partially mechanized further treatment up to at least including a measurement and classification of the semiconductor component elements. The elements obtained by subdividing having a thickness of say 250 micrometer are connected and held by intermediately disposed webs of silicone rubber.

In a particularly advantageous embodiment of the invention method, the structure of semiconductor component elements and silicon rubber is disposed in a device that will be designated as support frame in the further discussion, for supporting and processing of the semiconductor component elements in the course of further method steps. This support frame allows the production of the semiconductor component elements in a large series production, and after the measurement and classification of he semiconductor component elements, the semiconductor component elements are separated along and within the straps of silicone rubber, preferably starting with the side with the large intermediate space by separation starting with the free surface.

FIG. 2 illustrates a layout of a semiconductor starting chip 3 for producing semiconductor component elements 4 in such a support frame 1 according to the invention. The support frame, for example, can be produced from a stainless steel sheet metal with a thickness in the magnitude of the size of the semiconductor starting chips. Alternatively it can be made of plastic. The plastic can be, for example, a highly temperature stable material such as, for example, glass fiber reinforced melamine resin for process temperatures of 200 degrees centigrade. The thickness of the support frame can be from about 200 to 1000 micrometers. The configuration of the support frame can be rectangular or circular.

The central opening 2 is determined by the area extension of the semiconductor starting chip. The shape and the area extension of the support frame 1 depends on the type of employment in further process steps after the detachment of the structure from the carrier plate.

After the dicing of the semiconductor starting chip 3, the support frame 1 is placed preferably centered with respect to the semiconductor starting chip, which starting chip is shown by a dashed circumferential line, and is placed on the carrier plate. Then silicone rubber 5 is placed in the intermediate spaces between the semiconductor component elements and in the spaces between the outer elements of the structure and the support frame. Due to its required properties, the silicon rubber 5 is adhesively attached at the inner jacket face of the support frame 1 and forms with the enclosed semiconductor component elements 4 the foil-shaped structure at wafer 3 filling the opening 2 of the support frame 1. The thickness of the support frame can be chosen to be larger to achieve an increased mechanical stability of the arrangement comprising support frame 1 and structure 6.

The ordinarily unusable edge zone of the semiconductor starting chip, which edge zone is usually not suitable for processing, can be used for this construction. For this purpose the edge zone is formed as an annular ring during the dicing into semiconductor component elements. The edge zone formed as a ring is in conformity at its inner circumferential line with that of the opening 2 of the support frame 1. This means that in addition to the subdividing pattern there is also generated a circular groove at a small distance to the edge of the wafer. The thereby generated annular edge zone is now placed on the frame having a correspondingly smaller opening such that the inner edge coincides. This means that the support frame now exhibits a reinforced or thickened edge zone.

The support frame is then attached, for example adhesively, on the annular ring of semiconductor material disposed on the carrier in such a position that the support frame and the annular ring of semiconductor material are stacked congruently at their inner jacket faces. Such a combination of support frame and annular remainder of the semiconductor starting chip results in an advantageous enlargement of the rest surface of the silicone rubber, and thus a higher mechanical strength and stability is achieved for the complete construction.

In the case of the arrangement of the support frame 1 on the carrier plate, the adhesive for attaching the semiconductor starting chip 3 is preferably applied in such an extension that the support frame can also be attached with the adhesive. In order to detach the arrangement, it is heated and the adhesive is removed from the carrier plate with a suitable solvent. The heat-up temperature can be from about 100 to 120 degrees centigrade, the support frame can be of steel and the solvent can be trichloroethylene.

Alternatively, the opening 2 of the support frame can be disposed eccentrically relative to the center point.

According to another advantageous embodiment of the invention method, a device designated in the following as a support plate can be employed for supporting the semiconductor component elements in the structure 6 during further processing. The use and construction of such a support plate is illustrated in FIG. 3. The construction of such support plate can resemble that of the support frame in shape, size and material.

A semiconductor starting chip 3 is solidly attached on the carrier plate 10 with the aid of an adhesive 11. Semiconductor component elements 4 can be obtained from the semiconductor starting chip 3 by take-down milling or processing. The intermediately disposed spaces are filled with silicone rubber 5. The edge zone of the semiconductor starting disk 3 is still present. The support plate 13 is provided with bore holes 14, the disposition of which coincides with that of the semiconductor component elements 4. The shape and the extension of the bore holes is adapted to that of the semiconductor component elements. The support plate 13 is adhesively attached onto the structure with an adhesive 12, for example after the hardening of the silicone rubber 5. Alternatively, it can be put into position before the hardening of the silicone rubber, if the adhesive properties of the silicone rubber with respect to the semiconductor material are also effective with respect to the support plate. The support plate 13 is placed with its bore holes 14 centered relative to the semiconductor component elements of the structure 6, and, after the production of a solid connection, the support plate is detached from the carrier plate jointly with the structure of semiconductor component elements and silicone rubber. At least in sections, the support plate is formed with an area extension protruding beyond that of the structure in order to allow further processing such that the support plate together with the structure 6 can be easily detached and then employed as a carrier plate with a structure disposed on top or below. The protusions of the support plate beyond the range of the structure can be be formed such that manual or automatic operational steps can be performed by engaging the protrusions.

The shape of the support plate 13 is determined by the further processing step with an apparatus present or intended. The support plate can comprise structures for the fixing of several such support plates on a transport belt. The support plate can further comprise bore holes, bevelled edges, protrusions, thickened regions and the like to allow for a matching of a position at conveyor belts, devices or work area structures.

Furthermore, the position oriented placement or insertion of measurement contacts can be taken into consideration in the construction of the support plate. For example, measurement heads can be placed and position-adjusted on webs with recesses or holes running into bore holes of the support plate.

The support plate 13 can be made of metal or plastic. The metal can be aluminum or stainless steel. The plastic can be melamine resin reinforced with glass fibers.

Various characteristic value tests can be performed in a particularly economic way on the semiconductor component elements supported in a mechanically stable way by the support frame 1 or the support plate 13. For example, the reverse voltage, the switching times and the forward voltage drop can be determined. For this purpose the support frames and/or plates can be inserted into measurement apparatus or automatic systems, where upon simultaneous contacting of all elements according to a defined program the possible characteristic parameters are determined.

For example, the arrangements shown in FIGS. 2 and 3 allow in each case the simultaneous measurement in a suitable measurement apparatus of a characteristic value for all elements. For this purpose, the support means are, for example, provided with bore holes or edge openings for adjustment during transport or for insertion into an apparatus.

After the performance of all processing steps on the semiconductor component elements disposed in the joint composite, these semiconductor component elements can be separated in a desired way. This is done particularly advantageously by a separation by punching or with a laser beam.

The separation can be limited to the formation of element sequences out of which already classified elements can be sorted according to the quality grade already determined. For example, in a case of elements with different dimensions the elements of a certain geometrical size or shape can be separated. Alternatively, elements with the same experimentally determined properties can be separated and made ready for packing.

Furthermore, the invention method, by a controlled separation, allows a sequencing of the semiconductor component elements as a preparation step for mechanical processing or filled into magazines for a later loading into an automatic machine.

It will be understood that each of the elements described above, or two or more together, may also find a useful application in other types of semiconductor element production methods and structures differing from the types described above.

While the invention has been illustrated and described as embodied in the context of a system for the production of semiconductor elements, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method for the production of semiconductor component elements comprising
    adhesively attaching a large face semiconductor starting chip to a carrier plate, where the large face semiconductor starting chip includes a layer sequence with at least one p-n junction between two main surfaces and where the large face semiconductor starting chip is provided at each main surface with a metallic coating such that one main surface remains free;
    applying a mask with a dicing pattern on the free main surface;
    dicing the large face semiconductor starting chip into semiconductor component elements of smaller area extension and generating at each semiconductor component element a defined edge profile;
    entering a silicone rubber in the intermediate spaces generated by dicing of the formed intermediate spaces between the semiconductor component elements with a simultaneous covering of the semiconductor surface regions of the semiconductor component elements exposed because of the dicing, where the silicone rubber has the properties of forming a solid attachment on the semiconductor material, of releasing a support plate to be placed on said free main surface easily, and of being suitable for operation at temperatures for soft soldering operations with higher melting soft solders;
    disengaging a flexible structure from the carrier plate, where the flexible structure is formed from the straps of silicone rubber corresponding to the dicing pattern and from the semiconductor component elements supported between these straps;
    applying means for at least a partially mechanized further processing of the semiconductor component elements up to including measurements and classification; and
    separating the semiconductor component elements along and within the rubber strips.

2. The method for the production of semiconductor component elements according to claim 1 further comprising etching the large face semiconductor starting chip for dicing the same and for generating the desired edge profile.

3. The method for the production of semiconductor component elements according to claim 1 further comprising sandblasting the large face semiconductor starting chip for dicing the same and for generating the desired edge profile.

4. The method for the production of semiconductor component elements according to claim 1 further comprising sawing the large face semiconductor starting plate for dicing the same and for generating the desired edge profile.

5. The method for the production of semiconductor component elements according to claim 1 further comprising ultrasonically drilling the large face semiconductor starting chip for dicing the same and for generating the desired edge profile.

6. The method for the production of semiconductor component elements according to claim 1 further comprising employing a carrier plate produced from a member of the group consisting of glass, ceramics, plastic, metal or of a composite thereof.

7. The method for the production of semiconductor component elements according to claim 1 further comprising
    employing a support frame surrounding the semiconductor elements in the further mechanized processing of the semiconductor component elements;
    disposing the support frame on the carrier plate; connecting the support frame after the dicing of the starting semiconductor chip with the outer semiconductor component elements with the silicone rubber; and
    detaching the support frame with the semiconductor component elements from the carrier plate.

8. The method for the production of semiconductor component elements according to claim 1 further comprising
    employing a support plate comprising bore holes corresponding in their geometrical disposition to and surrounding the semiconductor component elements in the further mechanized processing of the semiconductor component elements;
    solidly attaching the support plate after the formation of the structure on the support plate with a centered coordination of bore holes and semiconductor component elements;
    detaching the support plate with the semiconductor component elements from the carrier plate.

9. The method for the production of semiconductor component elements according to claim 8 further comprising solidly attaching the support plate to the semiconductor component elements with an adhesive.

10. The method for the production of semiconductor component elements according to claim 8 further comprising placing the support plate onto the semiconductor component elements before the hardening of the silicone rubber; and connecting the semiconductor elements based on the adhesive force of the silicone rubber.

11. The method for the production of semiconductor component elements according to claim 1 further comprising adjusting the position of the semiconductor component elements in a support part, which support part holds the semiconductor component elements during further processing.

12. The method for the production of semiconductor component elements according to claim 11 further comprising employing a support part made of metal.

13. The method for the production of semiconductor component elements according to claim 11 further comprising employing a support part made of plastic.

14. A method for the production of semiconductor component elements comprising
- adhesively attaching a large face semiconductor starting chip to a carrier plate, where the large face semiconductor starting chip includes a layer sequence with at least one p-n junction between two main surfaces and where the large face semiconductor starting chip is provided at each main surface with a metallic coating such that one main surface remains free;
- applying a mask with a dicing pattern on the free main surface;
- dicing the large face semiconductor starting chip into semiconductor component elements of smaller area extension;
- entering a passivating and stabilizing material in the intermediate spaces generated by dicing of the formed intermediate spaces between the semiconductor component elements with a simultaneous covering of the semiconductor surface regions of the semiconductor component elements exposed because of the dicing; and
- disengaging the semiconductor component elements from the carrier plate;

wherein the improvement comprises
- generating at each semiconductor component element a defined edge profile during the dicing process;
- applying silicone rubber as a passivating and stabilizing material, where the silicone rubber has the properties of forming a solid attachment on the semiconductor material, of releasing a support plate to be placed on said free main surface easily, and of being suitable for operation at temperature for soft soldering operations with higher melting soft solders;
- forming a flexible structure of the semiconductor component elements and of the silicone rubber where the flexible structure is composed of the straps of silicone rubber corresponding to the dicing pattern and of the semiconductor component elements supported between these straps;
- disengaging the flexible structure from the carrier plate, applying means for at least a partially mechanized further processing of the semiconductor component elements up to including measurements and classification; and
- separating the semiconductor component elements along and within the rubber straps.

15. The method for the production of semiconductor component elements according to claim 14 further comprising
- employing a support frame surrounding the semiconductor elements in the further mechanized processing of the semiconductor component elements;
- disposing the support frame on the carrier plate;
- connecting the support frame after the dicing of the starting semiconductor chip with the outer semiconductor component elements with the silicone rubber; and
- detaching the support frame with the semiconductor component elements from the carrier plate.

16. The method for the production of semiconductor component elements according to claim 14 further comprising
- employing a support plate comprising bore holes corresponding in their geometrical disposition to and surrounding the semiconductor component elements in the further mechanized processing of the semiconductor component elements;
- solidly attaching the support plate after the formation of the structure on the support plate with a centered coordination of bore holes and semiconductor component elements;
- detaching the support plate with the semiconductor component elements from the carrier plate.

17. The method for the production of semiconductor component elements according to claim 16 further comprising solidly attaching the support plate to the semiconductor component elements with an adhesive.

18. The method for the production of semiconductor component elements according to claim 16 further comprising placing the support plate onto the semiconductor component elements before the hardening of the silicone rubber; and connecting the semiconductor elements based on the adhesive force of the silicone rubber.

* * * * *